United States Patent
Zhou et al.

(10) Patent No.: US 11,965,088 B2
(45) Date of Patent: Apr. 23, 2024

(54) ALCOHOL DISPERSION OF CONDUCTIVE POLYETHYLENEDIOXYTHIOPHENE, AND METHOD FOR PREPARING SAME AND USE OF SAME

(71) Applicant: HUAZHONG UNIVERSITY OF SCIENCE AND TECHNOLOGY, Hubei (CN)

(72) Inventors: Yinhua Zhou, Hubei (CN); Youyu Jiang, Hubei (CN); Xinyun Dong, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 18/264,652

(22) PCT Filed: Oct. 11, 2022

(86) PCT No.: PCT/CN2022/124484
§ 371 (c)(1),
(2) Date: Aug. 8, 2023

(87) PCT Pub. No.: WO2023/124367
PCT Pub. Date: Jul. 6, 2023

(65) Prior Publication Data
US 2024/0043682 A1 Feb. 8, 2024

(30) Foreign Application Priority Data
Dec. 31, 2021 (CN) .............. 202111666148

(51) Int. Cl.
*C08L 65/00* (2006.01)
*C08L 27/18* (2006.01)
(Continued)

(52) U.S. Cl.
CPC .............. *C08L 65/00* (2013.01); *C08L 27/18* (2013.01); *C09D 5/24* (2013.01); *C09D 7/20* (2018.01);
(Continued)

(58) Field of Classification Search
CPC ...... C08L 65/00; C08L 27/18; C08L 2201/50; C08L 2203/16; C08L 2203/204;
(Continued)

(56) References Cited

U.S. PATENT DOCUMENTS 8,641,926 B2 * 2/2014 Hsu .................. C08L 65/00
252/500
2010/0270055 A1 10/2010 Zheng et al.
2011/0210321 A1 * 9/2011 Elschner ........... C08G 61/126
257/E51.026

FOREIGN PATENT DOCUMENTS

CN 103304783 A 9/2013
CN 104448257 A 3/2015
(Continued)

OTHER PUBLICATIONS

Kawano et al., "Stress-Strain Curves of Nafion Membranes in Acid and Salt Forms," Polímeros: Ciência e Tecnologia, vol. 12, n° 2, pp. 96-101, 2002 (Year: 2002).*

(Continued)

*Primary Examiner* — Mark Kopec
*Assistant Examiner* — Jaison P Thomas
(74) *Attorney, Agent, or Firm* — HSML P.C.

(57) ABSTRACT

The present invention relates to the technical field of photoelectric materials, and in particular, to an alcohol dispersion of a conductive polyethylenedioxythiophene, and a method for preparing same and use of same. The present invention comprises a conductive polyethylenedioxythiophene and an alcohol, and the conductive polyethylenedioxythiophene comprises a polyethylenedioxythiophene cation and a fluorinated sulfonic acid ionomer counter anion. The present invention prepares a PEDOT alcohol dispersion by using an alcohol-dispersible highly fluorinated sulfonic acid ionomer as a counter anion to replace PSS, solving the hygroscopicity problem in conventional aqueous dispersions, and solving the problem that a conventional conductive aqueous dispersion of polyethylenedioxythiophene can- (Continued)

not be evenly applied on a hydrophobic surface due to high surface tension. The present invention has a simple synthesis process and is applicable to different substrates and different types of optoelectronic devices, thermoelectric devices, electrochromic thin films, and antistatic coatings, thus having broad prospects.

13 Claims, 4 Drawing Sheets

(51) Int. Cl.
  *C09D 5/24* (2006.01)
  *C09D 7/20* (2018.01)
  *C09D 127/18* (2006.01)
  *C09D 165/00* (2006.01)
  *H10K 85/10* (2023.01)
  *H10K 30/50* (2023.01)

(52) U.S. Cl.
  CPC ......... *C09D 127/18* (2013.01); *C09D 165/00* (2013.01); *H10K 85/113* (2023.02); *C08L 2201/50* (2013.01); *C08L 2203/16* (2013.01); *C08L 2203/204* (2013.01); *H10K 30/50* (2023.02)

(58) Field of Classification Search
  CPC .. C08L 27/22; C09D 5/24; C09D 7/20; C09D 127/18; C09D 165/00; C09D 127/22; H10K 85/113; H10K 30/50; C08G 61/12; C08J 3/09; Y02E 10/549
  See application file for complete search history.

(56) References Cited

FOREIGN PATENT DOCUMENTS

| CN | 107146842 A | 9/2017 | | |
|---|---|---|---|---|
| CN | 108089366 A | 5/2018 | | |
| CN | 114316223 A | 4/2022 | | |
| WO | WO-2012140881 A1 | * 10/2012 | ........... | C08G 61/126 |
| WO | WO-2014007299 A1 | * 1/2014 | ........... | C07D 495/04 |

OTHER PUBLICATIONS

International Search Report (with English translation) and Written Opinion issued in PCT/CN2022/124484, dated Jan. 11, 2023, 9 pages provided.

Notice of Allowance issued in CN202111666148.5, dated Aug. 23, 2022, with English translation.

Office Action issued in CN202111666148.5, dated Jun. 29, 2022, with English translation.

Merray-Rust et al., Proc. R. Soc. Lond. A 1929, 126, 84-106, available at https://royalsocietypublishing.org.

* cited by examiner

ALCOHOL DISPERSION OF CONDUCTIVE POLYETHYLENEDIOXYTHIOPHENE, AND METHOD FOR PREPARING SAME AND USE OF SAME

TECHNICAL FIELD

The present invention relates to the technical field of photoelectric materials, and in particular, to an alcohol dispersion of a conductive polyethylenedioxythiophene, and a method for preparing same and use of same.

BACKGROUND ART

A conductive polymer, poly(3,4-ethylenedioxythiophene):poly(styrenesulfonic acid) (PEDOT:PSS), has advantages such as high electrical conductivity and ionic conductivity, high optical permeability, and solution processability. It is widely applied in antistatic coatings, optoelectronic devices, energy storage devices, and bio-electronic devices, etc. Intrinsic PEDOT is an insoluble polymer. The water-soluble anionic polymer PSS contributes to water-dispersed PEDOT:PSS due to two effects: (1) as a counter anion forming an electrostatic interaction with the positively charged PEDOT; and (2) as a dispersant forming stable aqueous dispersion. At present, Heraeus (Germany) and Agfa (Belgium) etc. have developed PEDOT:PSS aqueous dispersions with different conductivities. However, the PEDOT:PSS aqueous dispersion has several disadvantages: (1) Poor wetting ability: Water has a high surface tension of 72 mN m$^{-1}$ at 25° C. That causes a de-wetting issue when the PEDOT:PSS aqueous solution is coated on a hydrophobic surface with low surface energy. (2) Acidity: the PEDOT:PSS aqueous dispersion has a pH value of 1.5 to 2.5, and may corrode metals, metal oxides, and other materials. (3) Hygroscopicity: PSS easily absorbs water, and the moisture absorption of the PEDOT:PSS thin film leads to decreased electrical properties and also easily causes acid corrosion of other functional materials, resulting in a decrease in device performance and lifetime.

The problems mentioned above are related to the use of water as a dispersion solvent for PEDOT:PSS. Specifically, these issues arise due to the following factors: (1) PSS dissociation in water: PSS has a very high dissociation rate in water, thus resulting in high acidity and hygroscopicity. (2) Poor wetting ability: The surface tension of water is high, resulting in a poor wetting ability of the PEDOT:PSS aqueous dispersion. Compared to water, alcohols have a low surface tension (for example, methanol and ethanol, with a surface tension of 22-23 mN m$^{-1}$). In addition, the dissociation rate of acids in alcohols is much lower than that in water [*Proc. R. Soc. Lond. A* 1929, 126, 84-106]. Therefore, alcohol-dispersed PEDOT is beneficial to improve wetting ability and decreased acidity, leading to better device performance and stability. However, the dispersion concentration of PSS in alcohols is lower than 5 mg/mL. This makes it challenging to achieve a stable PEDOT:PSS alcohol dispersion when PSS is used as the counter anion. While PEDOT:PSS dispersions reported in the literature are mostly in water or water-alcohol mixtures, there is an urgent need to develop a stable alcohol-dispersed PEDOT solution.

To sum up, there is still a lack of stable alcohol dispersions of a conductive polyethylenedioxythiophene in the prior works.

SUMMARY OF THE INVENTION

In view of the defects or improvement requirements in the prior art, the present invention provides an alcohol dispersion of a conductive polyethylenedioxythiophene, in which a PEDOT alcohol dispersion is prepared by using an alcohol-dispersible fluorinated sulfonic acid ionomer as a counter anion to replace PSS. Alcohol dispersions with different electrical conductivities are obtained by controlling the doping ratio of perfluorosulfonic acid ionomer to thiophene monomer in the synthesis process. The alcohol dispersion is characterized by weak acidity and does not corrode metal oxides such as ZnO and metals. Additionally, due to its high wetting ability, the dispersion can be used to create a uniform, conductive thin film through coating processes like spin coating, blade coating, and slot-die coating, without the need for surfactant additives.

To achieve the foregoing objectives, according to one aspect of the present invention, a conductive polyethylenedioxythiophene is provided, which comprises a polyethylenedioxythiophene cation and a fluorinated sulfonic acid ionomer counter anion, and has a structure shown by formula (1):

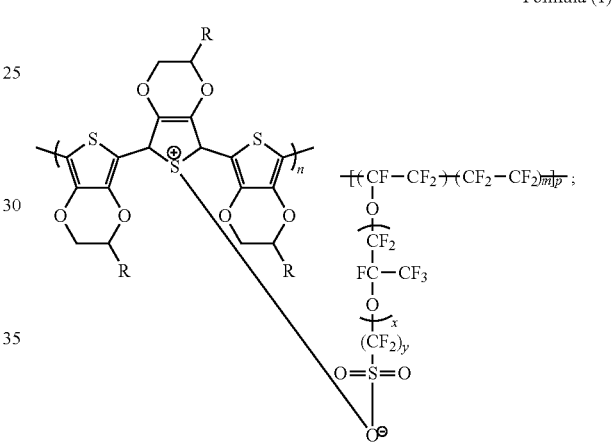

Formula (1)

Where n is the degree of polymerization of polyethylenedioxythiophene and is any integer from 2 to 100; p is the degree of polymerization of a fluorinated sulfonic acid polymer and is any integer from 2 to 100; m is any real number from 1 to 20; x is 0 or 1; y is any integer from 1 to 5; and R is a hydrogen atom, hydroxyl, alkyl, alkoxy, fluoroalkyl, ester group, carboxyl, thioalkyl, aryl, or heteroaryl.

In the formula (1) of the present invention, m is an average degree of polymerization. The polymer is composed of polymer homologue molecules of different degrees of polymerization, and m is a number-average degree of polymerization averaged by the number of molecules and may be a non-integer.

Preferably, R is a hydrogen atom or fluoroalkyl.

Preferably, m in the formula (1) ranges from 4.5 to 10, x is 1, and y ranges from 1 to 3.

According to another aspect of the present invention, a method for preparing a conductive polyethylenedioxythiophene is provided, characterized in that a fluorinated sulfonic acid ionomer and a thiophene monomer are dissolved in a solvent to prepare a dispersion with a mass concentration of 1% to 30%; and then an oxidant is added for reaction to obtain a blue-black liquid, and the unreacted monomer and oxidant are removed by dialysis through a semi-permeable membrane, followed by centrifugal separation, to obtain the conductive polyethylenedioxythiophene.

Preferably, the solvent is water or alcohols.

Preferably, when the solvent is water, the oxidant is a water-soluble oxidant or an alcohol-soluble oxidant;

when the solvent is alcohol, the oxidant is an alcohol-soluble oxidant;

wherein the water-soluble oxidant comprises at least one of trivalent iron salt, persulfate, peroxide, $V_2O_5$, $VOCl_3$, and $SbCl_5$; and the alcohol-soluble oxidant comprises at least one of dibenzoyl peroxide and phosphomolybdic acid.

According to another aspect of the present invention, a method for preparing an alcohol dispersion of a conductive polyethylenedioxythiophene is provided, characterized in that the conductive polyethylenedioxythiophene is ultrasonically dispersed into alcohols, to obtain the alcohol dispersion of the conductive polyethylenedioxythiophene.

Preferably, the alcohol solution is one or a mixture of two or more of an aliphatic alcohol solution, an alicyclic alcohol solution, and an aromatic alcohol solution.

According to another aspect of the present invention, a method for preparing an alcohol dispersion of conductive polyethylenedioxythiophene is provided, characterized in that a fluorinated sulfonic acid ionomer and a thiophene monomer are added to an alcohol solution to prepare a dispersion with a mass concentration of 1% to 30%; and then an oxidant is added for reaction to obtain a blue-black liquid, and the unreacted monomer and oxidant are removed by dialysis through a semi-permeable membrane, to obtain the alcohol dispersion of the conductive polyethylenedioxythiophene.

According to another aspect of the present invention, applications for an alcohol dispersion of conductive polyethylenedioxythiophene are provided, comprising use in a solar cell, a light-emitting diode, an electrochromic film, a thermoelectric material, an antistatic coating, a flexible electronic device, or a stretchable elastomer sensor.

Because an anionic polymer is used as a dispersant, the key to preparing the PEDOT alcohol dispersion is to obtain an alcohol-dispersible counterion polymer. However, the anionic polymers described in the literature have a low dispersion concentration in alcohols (<5 mg/mL), which limits their applicability for the preparation of PEDOT alcohol dispersion. It is found that highly fluorinated sulfonic acid ionomers has two solubility parameters: 16.71-17.37 $cal^{0.5}$ $cm^{-1.5}$ and 9.61-10.08 $cal^{0.5}$ $cm^{-1.5}$, where the former one is attributed to a hydrophilic acid ion group and the latter one is attributed to a hydrophobic polytetrafluoroethylene group. The two solubility parameters are similar to the solubility parameters of water (23.4 $cal^{0.5}$ $cm^{-1.5}$) and ethanol (12.7 $cal^{0.5}$ $cm^{-1.5}$), respectively. Therefore, the dispersion concentrations of the highly fluorinated sulfonic acid ionomer in water and alcohols are both larger than 20 mg/mL. Therefore, the present invention uses an alcohol-dispersible highly fluorinated sulfonic acid ionomer as a counter anion to replace PSS to prepare the PEDOT alcohol dispersion. The alcohol dispersions with different electrical conductivities are obtained by controlling the doping ratio of perfluorosulfonic acid ionomer to thiophene monomer in the synthesis process. The dispersion of alcohol has a weak acidic property and does not cause corrosion in metal oxides like ZnO and metals. With a high wetting ability, a uniform conductive thin film can be prepared by a coating process such as spin coating, blade coating, and slot-die coating without the need for adding a surfactant. In addition, this anionic polymer contains many hydrophobic —$CF_2$— groups, the prepared PEDOT thin film has high hydrophobicity. Therefore, the alcohol dispersion of the conductive polyethylenedioxythiophene is applicable as hole-transporting layer and/or electrodes of a photoelectric device (such as a solar cell, a light-emitting diode, a photodetector, etc.), an antistatic coating, an electrochromic device, a thermoelectric material, a bio-electronic device, etc.

To sum up, the present invention has the following advantageous effects:

(1) The present invention uses an alcohol-dispersible fluorinated sulfonic acid ionomer as a counterion to replace PSS to prepare the PEDOT alcohol dispersion. The alcohol dispersions with different electrical conductivities are obtained by controlling the doping ratio of perfluorosulfonic acid ionomer to thiophene monomer in the synthesis process. The PEDOT alcohol dispersions are weakly acidic and do not corrode metal oxides such as ZnO and metals. The PEDOT alcohol dispersion has a good wetting ability, and can be used to prepare a uniform conductive thin film by a coating process such as spin coating, blade coating, and slot-die coating without the need for adding a surfactant. The PEDOT alcohol dispersion not only solves the hygroscopicity problem, but also addresses the de-wetting issues that arise when coating a hydrophobic surface, unlike the conventional PEDOT:PSS aqueous dispersion.

(2) The present invention offers an alcohol dispersion of conductive polyethylenedioxythiophene that is weakly acidic or neutral, which effectively prevents the corrosion of metal oxides, metal electrodes, and metal nanowires caused by the strong acidity of conventional aqueous dispersions. Additionally, the alcohol dispersion has a relatively low surface tension, enabling its application on any surface to prepare a uniform conductive thin film.

(3) The present invention offers a simple synthesis process and can be applied to various substrates and optoelectronic, thermoelectric, electrochromic, antistatic, and bio-electronic devices, making it highly versatile and promising for a range of applications

DETAILED DESCRIPTION

Figure 1:
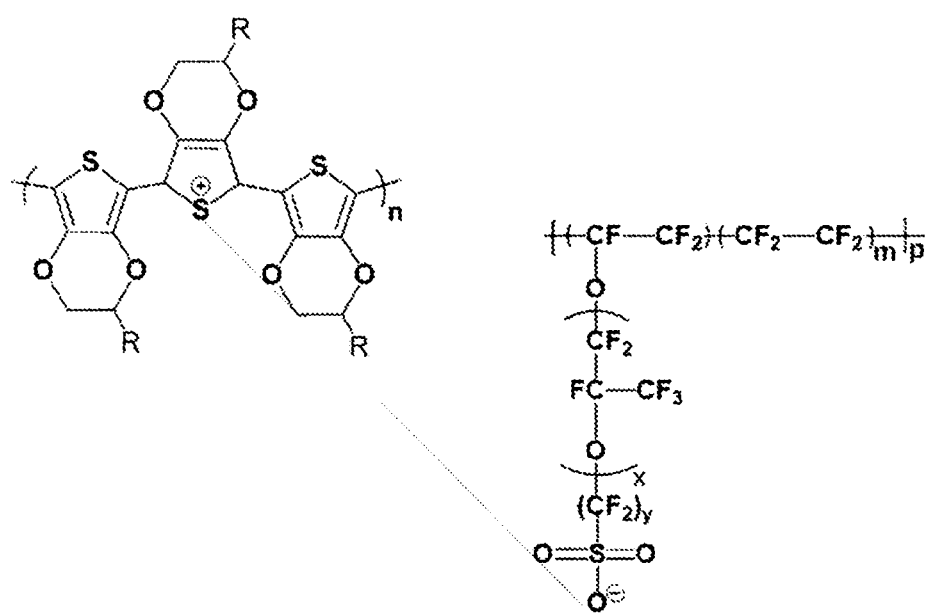
FIG. 1 is a schematic structural diagram of a conductive polyethylenedioxythiophene.

To make the purpose, technical solution, and advantages of the present invention clearer, the present invention is further described in detail below in connection with the accompanying drawings and embodiments. It should be appreciated that the specific embodiments described here are used merely to explain the present invention and are not used to define the present invention. In addition, the technical features involved in various embodiments of the present invention described below can be combined with each other as long as they do not constitute a conflict therebetween.

EXAMPLES

A conductive polyethylenedioxythiophene includes a polyethylenedioxythiophene cation and a fluorinated sulfonic acid ionomer counter anion, and has a structure shown by formula (1):

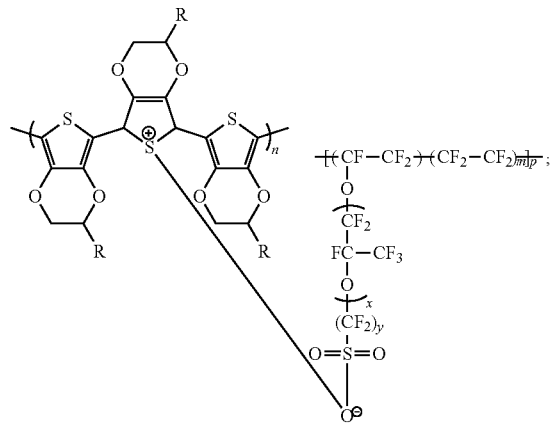

Formula (1)

where n is the degree of polymerization of polyethylenedioxythiophene and is any integer from 2 to 100; p is the degree of polymerization of a fluorinated sulfonic acid polymer and is any integer from 2 to 100; m is any number from 1 to 20; x is 0 or 1; y is any integer from 1 to 5; and R is a hydrogen atom, hydroxyl, alkyl, alkoxy, fluoroalkyl, ester group, carboxyl, thioalkyl, aryl, or heteroaryl.

Preferably, R is a hydrogen atom or fluoroalkyl.

Preferably, m in the formula (1) ranges from 4.5 to 10, x is 1, and y ranges from 1 to 3.

Example 1

An alcohol dispersion of a conductive polyethylenedioxythiophene was synthesized by the following method: 2 mL of a 10 wt % aqueous solution of perfluorosulfonic acid ionomer (PFI, with the molecular weight of the monomer of 1094 g/mol and having a molecular structure shown by formula (2)) and 20 μL of 3,4-ethylenedioxythiophene monomer were added to 6 mL deionized water and stirred at room temperature for 1 h. After stirring into a milky white liquid, an oxidant was slowly added dropwise. The oxidant was prepared by dissolving 60.75 mg of ferric trichloride ($FeCl_3$) in 3 mL of deionized water. After the oxidant was added, the milky white liquid started to gradually become blue and then a blue-black liquid after 12 h reaction. The blue-black liquid was placed in a semi-permeable membrane to remove small molecule impurities and the excess oxidant by dialysis. The liquid was removed after 18 h, and was subjected to high-speed centrifugation at 10000 rpm, to obtain a blue-black solid. The blue-black solid was added to an alcohol solvent, and was processed by ultrasonic cell pulverization for 10 h, to obtain an alcohol dispersion of the conductive polyethylenedioxythiophene (PEDOT:F). The alcohol dispersion of the conductive polyethylenedioxythiophene has a mass fraction of 1.3 wt. % to 1.8 wt. %.

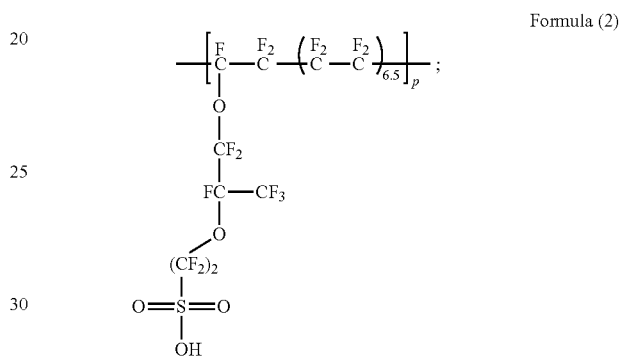

Formula (2)

where p is any integer from 1 to 20.

A film was fabricated using a spin-coating method. Specifically, dynamic spin-coating was carried out on a clean glass substrate to prepare a PEDOT:F solution, with spin-coating speeds of 1000 rpm, 2000 rpm, 3500 rpm, and 5000 rpm, respectively. The spin-coated PEDOT:F thin films with varied thicknesses of 53.0 nm, 46.1 nm, 35.8 nm, and 25.2 nm, respectively. Then coated films are annealed at 100° C. for 5 min.

Figure 2:
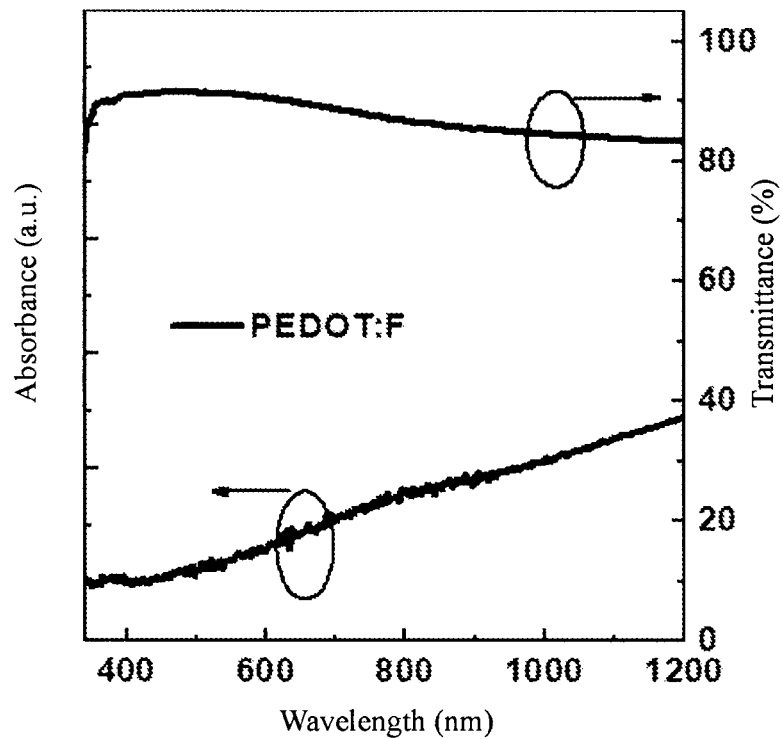
FIG. 2 shows absorbance and transmittance spectrum of PEDOT:F thin film with the thickness of 46.1 nm prepared in Example 1.

For instance, a PEDOT:F thin film with a thickness of 46.1 nm has an absorbance and transmittance curve depicted in FIG. 2. Moreover, the work function of the PEDOT:F film was tested to be 5.4 eV.

Figure 3:
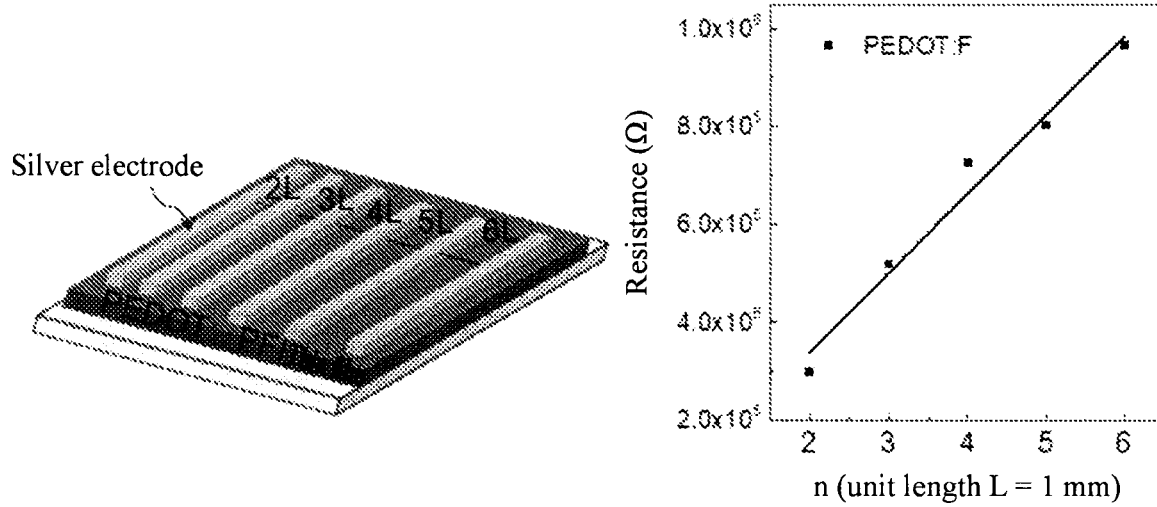
FIG. 3 shows electrical conductivity of the 46.1 nm PEDOT:F thin film prepared in Example 1, where the left schematic in FIG. 3 shows device structure for conductivity measurement and the right graph in FIG. 3 shows resistance measurement and a fitting curve.

The electrical conductivity is calculated using the 46.1 nm thin film. The left graph in FIG. 3 shows conductivity testing and the right graph in FIG. 3 shows testing of resistance and a fitting curve. The electrical conductivity of the thin film is calculated to be $5.4 \times 10^{-3}$ S/cm.

Example 2

An alcohol dispersion of a conductive polyethylenedioxythiophene was synthesized by the following method: 10 mL of a 20 wt % solution of perfluorosulfonic acid ionomer (PFI, with a molecular weight of the monomer of 1094 g/mol) in a water-alcohol mixture, 0.6 g of 3,4-ethylenedioxythiophene monomer oxidant, and 1.05 g of an oxidant dibenzoyl peroxide (BPO) were added to 10 mL of ethanol. The mixture was continuously stirred for 48 h to become a blue-black liquid. In the post-processing phase, the blue-black liquid was placed in a semi-permeable membrane for dialysis, where the dialysis solvent was a mixture of ethanol: water of 1:1 by volume; and dialysis was performed for 24 h to remove small molecule impurities and the excess oxidant, to obtain an alcohol dispersion. The prepared alcohol dispersion of the conductive polyethylenedioxythiophene has a mass fraction of 1.3 wt. % to 1.8 wt. %.

A film was fabricated using a spin-coating method. Specifically, dynamic spin-coating was carried out on a clean glass substrate to prepare a PEDOT:F solution, with spin-coating speeds of 2000 rpm, 3500 rpm, and 5000 rpm, respectively. The spin-coated PEDOT:F thin films with varied thicknesses of 37.0 nm, 28.4 nm, and 18.2 nm, respectively. Then coated films are annealed at 100° C. for 5 min. Take the PEDOT:F thin film with a thickness of 37.0 nm as an example, its work function is tested to be 5.3 eV, and its electrical conductivity is tested to be $4.2 \times 10^{-3}$ S/cm.

Example 3

The preparation method of this example was the same as that in Example 1, with the main difference in that the perfluorosulfonic acid ionomer had a structure shown by formula (3):

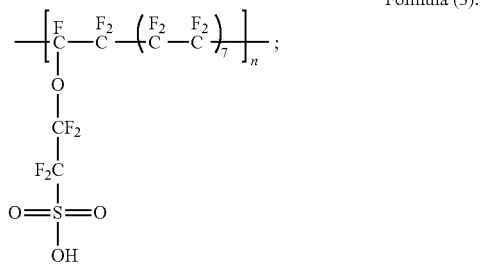

Formula (3).

Example 3

The preparation method of this example was the same as that in Example 4, with the main difference in that the perfluorosulfonic acid ionomer had a structure shown by formula (4):

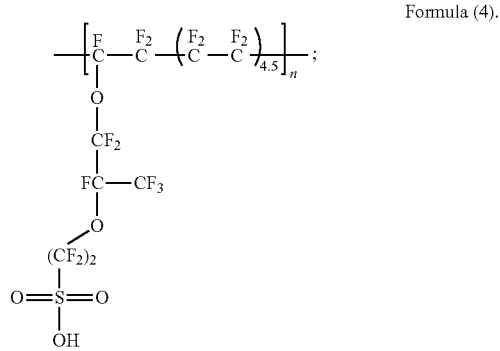

Formula (4).

Application Examples

Application Example 1

A thin film prepared with the alcohol dispersion of the conductive polyethylenedioxythiophene in Example 1 was directly used as a hole transport layer of an organic solar cell with an inverted structure.

Figure 4:
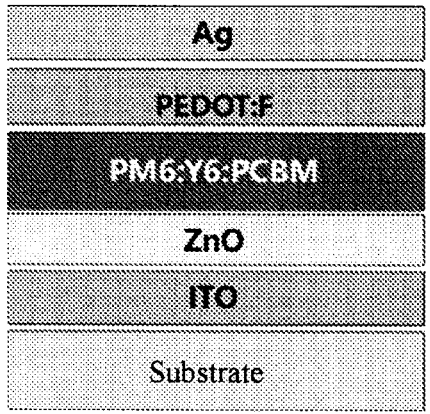
FIG. 4 shows a structure and test diagram of an organic solar cell with an inverted structure in Application Example 1, where the left graph in FIG. 4 is a schematic diagram of a device structure of the inverted organic solar cell, and the right graph in FIG. 4 is a test diagram of current density-voltage of the organic solar cell.
Figure 4:
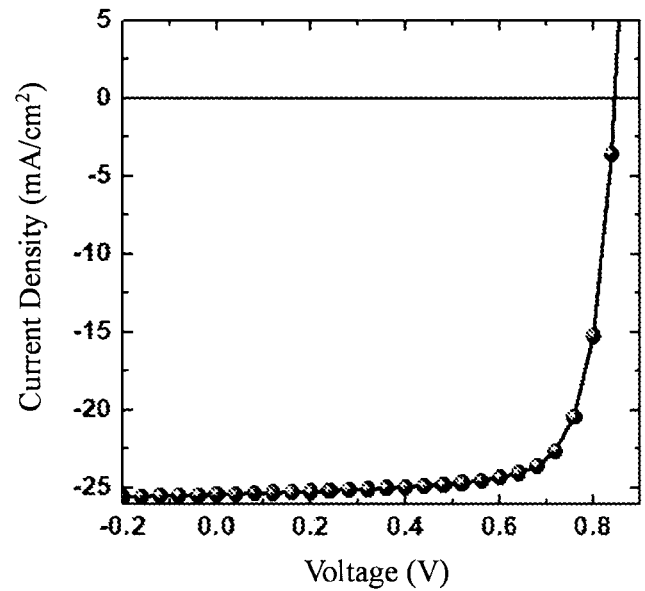

The device structure of the inverted organic solar cell is glass/ITO/ZnO/PM6:Y6:PCBM/PEDOT:F/Ag (left graph of FIG. 4). The ITO glass is a cathode layer, ZnO serves as an electron transport layer, PM6:Y6:PCBM serves as a photoactive layer, PEDOT:F serves as a hole transport layer, and Ag serves as an anode layer. A specific preparation process was as follows:

A transparent indium tin oxide (ITO) electrode glass was ultrasonically cleaned with deionized water, acetone, and isopropyl alcohol successively for 15 min. A zinc oxide sol-gel solution was spin-coated on the cleaned ITO glass at a speed of 3000 rpm, and was then heated at 200° C. for 15 min. A PM6:Y6:PCBM solution (with a total concentration of 15.4 mg/mL and a mass ratio of 1:1:0.2, and chloroform as solvent) was spin-coated on the above substrate at a speed of 2500 rpm, and was then annealed at 100° C. for 10 min. The alcohol dispersion of the conductive polyethylenedioxythiophene was spin-coated on the above active layer at a speed of 3000 rpm and then annealed at 100° C. for 5 min, where the thin film prepared with the alcohol dispersion of the conductive polyethylenedioxythiophene had an electrical conductivity of $5.4 \times 10^{-2}$ S/cm and a work function of 5.4 eV. Finally, the device was moved into an evaporation chamber, and a 100 nm silver electrode was deposited by evaporation after the vacuum pressure is less than $5 \times 10^{-7}$ Torr.

The current density-voltage curve of the prepared organic solar cell is shown in the right graph of FIG. 4, where "Voltage" represents the voltage and "current density" represents the current density, the open-circuit voltage is $V_{OC}=0.85$ V, the current density is $J_{SC}=25.40$ mA/cm$^2$, the fill factor is FF=0.76, and the efficiency is PCE=16.40%.

Application Example 2

A thin film prepared with the alcohol dispersion of the conductive polyethylenedioxythiophene in Example 1 was directly used as a hole transport layer of an organic solar cell with a regular structure.

Figure 5:
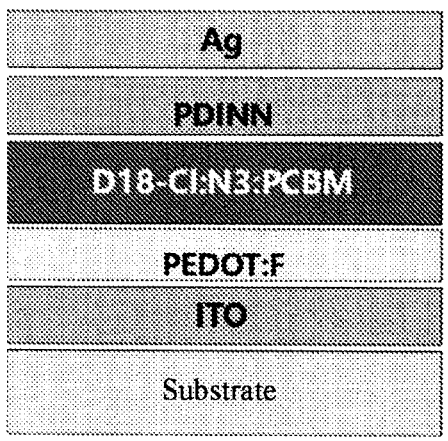
FIG. 5 shows a structure and test diagram of an organic solar cell with a regular structure in Application Example 2, where the left graph in FIG. 5 is a schematic diagram of a device structure of the regular organic solar cell, and the right graph in FIG. 5 is a test diagram of current density-voltage of the organic solar cell.
Figure 5:
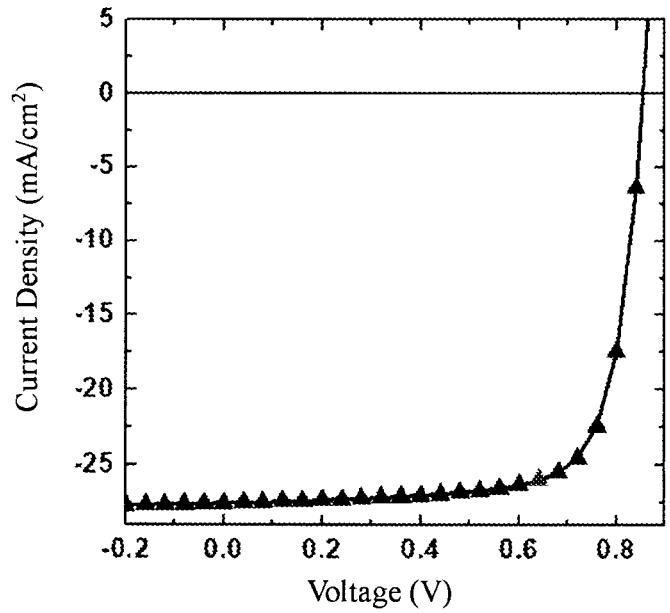

Preparation of the organic solar cell with a regular structure: the device structure of the regular organic solar cell is glass/ITO/PEDOT:F/D18-Cl:N3:PCBM/PDINN/Ag (the left graph of FIG. 5). The ITO glass is an anode layer, PEDOT:F serves as a hole transport layer, D18-Cl:N3:PCBM serves as a photoactive layer, PDINN serves as an electron transport layer, and Ag serves as a cathode layer. A specific preparation process was as follows:

A transparent indium tin oxide (ITO) electrode glass was ultrasonically cleaned with deionized water, acetone, and isopropyl alcohol successively for 15 min. The alcohol dispersion of the conductive polyethylenedioxythiophene (PEDOT:F) was spin-coated on the cleaned ITO glass sheet at a speed of 3000 rpm and then heated at 100° C. for 5 min. The thin film prepared with the alcohol dispersion of the conductive polyethylenedioxythiophene had an electrical conductivity of $5.4 \times 10^{-2}$ S/cm and a work function of 5.4 eV. The D18-Cl:N3:PCBM solution (with a total concentration of 15 mg/mL and a mass ratio of 1:1.4:0.1, and chloroform as solvent) was spin-coated on the above substrate at a speed of 4000 rpm without annealing. A PDINN solution (with a total concentration of 1 mg/mL, and methanol as solvent) was spin-coated on the above active layer at a speed of 3000 rpm without annealing. Finally, the device was moved into an evaporation chamber, and a 100 nm silver electrode was deposited by evaporation after the vacuum pressure is less than $5 \times 10^{-7}$ Torr.

The current density-voltage curve of the prepared organic solar cell is shown in the right graph of FIG. 5, where "Voltage" represents the voltage and "current density" represents the current density, the open-circuit voltage is $V_{OC}=0.85$ V, the current density is $J_{SC}=27.54$ mA/cm$^2$, the fill factor is FF=0.75, and the efficiency is PCE=17.67%.

Application Example 3

A thin film prepared with the alcohol dispersion of the conductive polyethylenedioxythiophene in Example 1 was directly used as a hole transport layer of an organic solar cell with an all-solution-processed structure.

Figure 6:
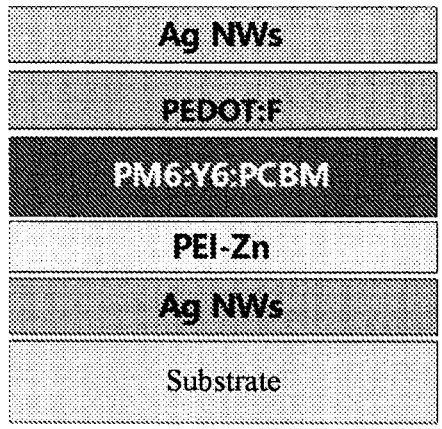
FIG. 6 shows a structure and test diagram of an organic solar cell with an all-solution-processed structure in Application Example 3, where the left graph in FIG. 6 is a schematic diagram of a device structure of the all-solutionprocessed organic solar cell, and the right graph in FIG. 6 is a test diagram of current density-voltage of the organic solar cell.
Figure 6:
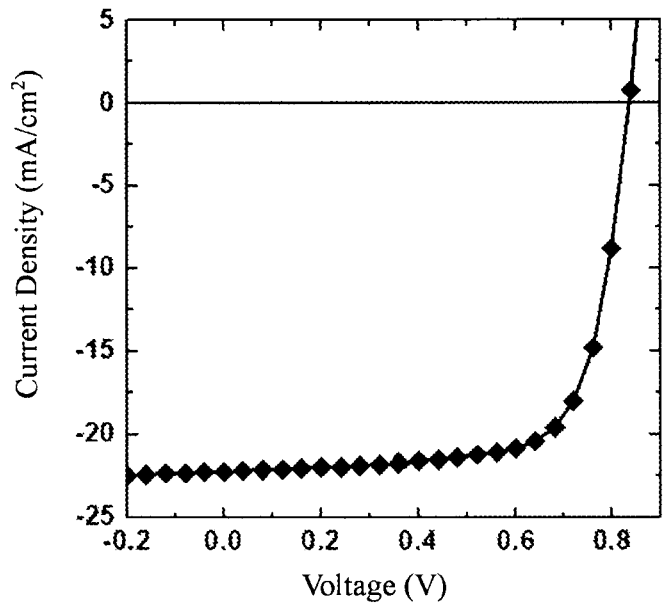

Preparation of the all-solution-processed organic solar cell: the device structure of the all-solution-processed organic solar cell is glass/Ag NWs/PEI-Zn/PM6:Y6:PCBM/PEDOT:F/Ag NWs (the left graph of FIG. 6). The glass is a substrate, the silver nanowires (Ag NWs) are a cathode layer, PEI-Zn serves as an electron transport layer, PM6:Y6:PCBM serves as a photoactive layer, PEDOT:F serves as a hole transport layer, and Ag NWs serve as an anode layer. A specific preparation process was as follows:

A cut glass was ultrasonically cleaned with deionized water, acetone, and isopropyl alcohol successively for 15 min. An ethanol dispersion of Ag NWs with a concentration of 10 mg/mL was blade-coated on the cleaned glass sheet. The substrate temperature in blade coating was 35° C., the blade coating speed was 10 mm/s, and the gap was 100 μm. Blade coating was repeated many times till the sheet resistance of Ag NWs reached 20 Ω/sq, and then Ag NWs were patterned with laser. On the patterned transparent electrode, an electron transport layer PEI-Zn was blade-coated, where the substrate temperature of blade coating was 50° C., the blade coating speed was 10 mm/s, and the gap of the blade coating was 150 μm. Then, substrates are annealled at 150° C. for 10 min after blade coating. An active layer material PM6:Y6:PCBM (with a total concentration of 15.4 mg/mL and a mass ratio of 1:1:0.2, and chloroform as solvent) was blade-coated on the above electron transport layer, where the blade coating speed was 20 mm/s and the gap of blade coating was 150 μm. Following the completion of blade coating, the sample was heated in a nitrogen-atmosphere glove box at 100° C. for 10 minutes. The hole transport layer comprised of PEDOT:F was then blade-coated onto the active layer, using the following conditions: substrate temperature during blade coating at 35° C., blade coating speed of 10 mm/s, and a gap of 150 μm. The thin film prepared with the alcohol dispersion of the conductive polyethylenedioxythiophene had an electrical conductivity of $6.8\times10^{-4}$ S/cm and a work function of 5.7 eV. Finally, 2 mg/ml of an ethanol dispersion of Ag NWs was deposited on PEDOT:F as an anode layer by spray coating, where the sheet resistance of the anode layer Ag NWs was 17 Ω/sq.

The current density-voltage curve of the organic solar cell is shown in the right panel of FIG. 6, where "Voltage" represents the voltage and "current density" represents the current density, the open-circuit voltage is $V_{OC}=0.84$ V, the current density is $J_{SC}=22.25$ mA/cm$^2$, the fill factor is FF=0.72, and the efficiency is PCE=13.45%.

Application Example 4

The thin film prepared with the alcohol dispersion of the conductive polyethylenedioxythiophene in Example 1 was used to prepare an antistatic coating by means of blade coating.

A specific preparation process of the antistatic coating was as follows: a glass of 2.5×7.5 cm$^2$ was ultrasonically cleaned with deionized water, acetone, and isopropyl alcohol successively for 15 min. The clean glass was placed on a blade-coating table with a substrate temperature of 50 μL of the alcohol dispersion of the conductive polyethylenedioxythiophene was deposited, where a gap of doctor blading was set to 150 μm and the blade coating speed was set to mm/s. After the blade coating, the film was annealed at 100° C. for 5 min. Blade coating was performed by alternating between forward and reverse directions for 1 to 20 times under the specified conditions. The resulting thin film had an adjustable thickness ranging from 40 nm to nm, as well as an adjustable sheet resistance ranging from $10^3\Omega$ to $10^6\Omega$.

Application Example 5

The thin film prepared with the alcohol dispersion of the conductive polyethylenedioxythiophene in Example 1 was used to prepare a thermoelectric device by spin coating.

A specific preparation process of the thermoelectric device was as follows: a glass of 2.5×5 cm$^2$ was ultrasonically cleaned with deionized water, acetone, and isopropyl alcohol successively for 15 min. The alcohol dispersion of the conductive polyethylenedioxythiophene was spin-coated on the cleaned glass sheet at a speed of 800 rpm for 45 s. Then the film is annealed at 100° C. for 10 min. The metallic silver with an evaporation area of 2.5×0.2 cm$^2$ at both ends of the thin film was drawn out as electrodes.

Figure 7:
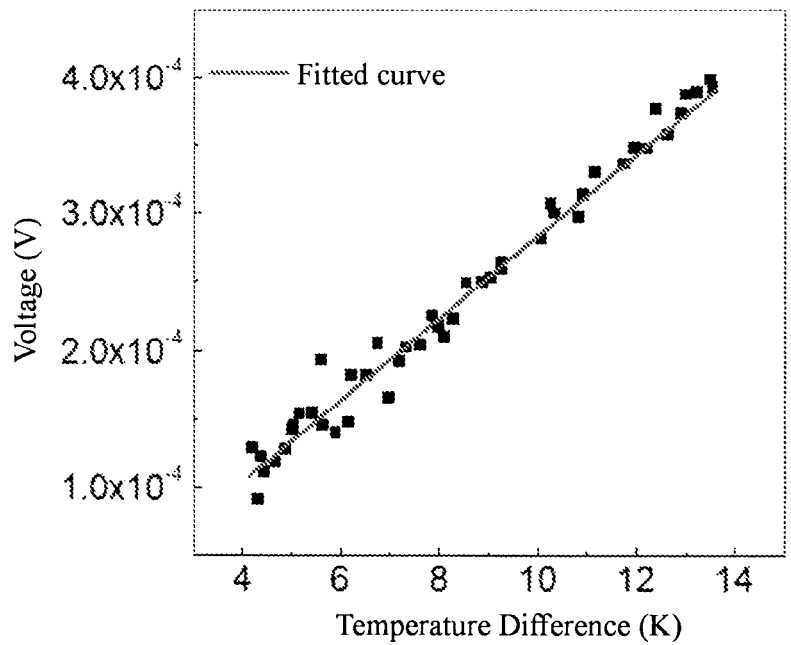
FIG. 7 is a graph of temperature difference-voltage of a thermoelectric device in Application Example 4.

A graph of temperature difference-voltage of the prepared thermoelectric device is shown in FIG. 7. According to the fitted curve, the Seebeck coefficient is 29.9 μV/K and the power factor is $4.83\times10^{-3}$ μW/mK$^2$.

To sum up, the alcohol dispersion of the conductive polyethylenedioxythiophene provided by the present invention is simple in synthesis process, easy to process, and compatible with various surfaces and processes. The thin film prepared with the dispersion shows great application potential in device structures such as an organic solar cell, an antistatic coating, and a thermoelectric device.

It can be easily understood by those skilled in the art that the foregoing description is only preferred embodiments of the present invention and is not intended to limit the present invention. All the modifications, identical replacements and improvements within the spirit and principle of the present invention should be in the scope of protection of the present invention.

The invention claimed is:

1. An alcohol dispersion of a conductive polyethylenedioxythiophene, comprising:
    a conductive polyethylenedioxythiophene comprising a polyethylenedioxythiophene cation and a fluorinated sulfonic acid ionomer counter anion, and having a structure shown by formula (1):

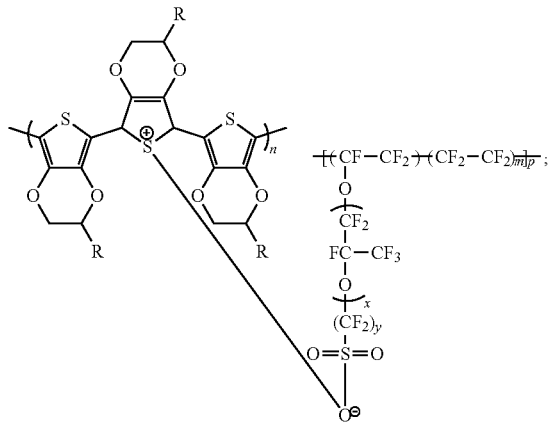

Formula (1)

where n is the degree of polymerization of polyethylenedioxythiophene and is any integer from 2 to 100; p is the degree of polymerization of a fluorinated sulfonic acid polymer and is any integer from 2 to 100; m is any real number from 1 to 20; x is 0 or 1; y is any integer from 1 to 5; and R is a hydrogen atom, hydroxyl, alkyl, alkoxy, fluoroalkyl, ester group, carboxyl, thioalkyl, aryl, or heteroaryl, and a solvent that comprises an alcohol solution, wherein the conductive polyethylenedioxythiophene is ultrasonically dispersed into the solvent so as to obtain the alcohol dispersion of the conductive polyethylenedioxythiophene, and wherein the alcohol solution is one or a mixture of two or more of an aliphatic alcohol solution, an alicyclic alcohol solution, and an aromatic alcohol solution.

2. The alcohol dispersion of a conductive polyethylenedioxythiophene according to claim 1, wherein R is a hydrogen atom or fluoroalkyl.

3. The alcohol dispersion of a conductive polyethylenedioxythiophene according to claim 1, wherein m in formula (1) ranges from 4.5 to 10, x is 1, and y ranges from 1 to 3.

4. A method for preparing an alcohol dispersion of a conductive polyethylenedioxythiophene of claim 1, comprising:

providing a fluorinated sulfonic acid ionomer and 3,4-ethylenedioxythiophene monomer comprising an R-group side chain, wherein the R-group side chain is a hydrogen atom, hydroxyl, alkyl, alkoxy, fluoroalkyl, ester group, carboxyl, thioalkyl, aryl, or heteroaryl;

adding the fluorinated sulfonic acid ionomer and 3,4-ethylenedioxythiophene monomer in a solvent to prepare a dispersion with a mass concentration of 1% to 30%;

adding an oxidant to the dispersion for reaction to obtain a blue-black liquid; and removing the unreacted monomer and oxidant from the blue-black liquid by dialysis through a semi-permeable membrane, followed by centrifugal separation, to obtain a blue-black solid;

adding the blue-black solid to an alcohol solution, and processing the blue-black solid and the alcohol solution by ultrasonic cell pulverization to obtain the alcohol dispersion of the conductive polyethylenedioxythiophene according to claim 1, wherein the alcohol solution is one or a mixture of two or more of an aliphatic alcohol solution, an alicyclic alcohol solution, and an aromatic alcohol solution.

5. The method for preparing an alcohol dispersion of a conductive polyethylenedioxythiophene according to claim 4, wherein the solvent is water or an alcohol solution.

6. The method for preparing an alcohol dispersion of a conductive polyethylenedioxythiophene according to claim 5, wherein when the solvent is water, the oxidant is a water-soluble oxidant or an alcohol-soluble oxidant; or when the solvent is an alcohol, the oxidant is an alcohol-soluble oxidant;

wherein the water-soluble oxidant comprises at least one of trivalent iron salt, persulfate, peroxide, $V_2O_5$, $VOCl_3$, and $SbCl_5$; and the alcohol-soluble oxidant comprises at least one of dibenzoyl peroxide and phosphomolybdic acid.

7. A solar cell comprising an alcohol dispersion of a conductive polyethylenedioxythiophene according to claim 1.

8. A light-emitting diode comprising an alcohol dispersion of a conductive polyethylenedioxythiophene according to claim 1.

9. An electrochromic film comprising an alcohol dispersion of a conductive polyethylenedioxythiophene according to claim 1.

10. A thermoelectric material comprising an alcohol dispersion of a conductive polyethylenedioxythiophene according to claim 1.

11. An antistatic coating comprising an alcohol dispersion of a conductive polyethylenedioxythiophene according to claim 1.

12. A flexible electronic device comprising an alcohol dispersion of a conductive polyethylenedioxythiophene according to claim 1.

13. A stretchable elastomer sensor comprising an alcohol dispersion of a conductive polyethylenedioxythiophene according to claim 1.

* * * * *